United States Patent
Cong et al.

(10) Patent No.: US 11,315,471 B2
(45) Date of Patent: Apr. 26, 2022

(54) SHIFT REGISTER UNIT, DRIVING DEVICE, DISPLAY DEVICE AND DRIVING METHOD

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Lele Cong, Beijing (CN); Jian Sun, Beijing (CN); Zhen Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 627 days.

(21) Appl. No.: 16/323,406

(22) PCT Filed: May 31, 2018

(86) PCT No.: PCT/CN2018/089281
§ 371 (c)(1),
(2) Date: Feb. 5, 2019

(87) PCT Pub. No.: WO2019/056795
PCT Pub. Date: Mar. 28, 2019

(65) Prior Publication Data
US 2021/0335193 A1 Oct. 28, 2021

(30) Foreign Application Priority Data
Sep. 21, 2017 (CN) .......................... 201710859100.3

(51) Int. Cl.
*G09G 3/20* (2006.01)

(52) U.S. Cl.
CPC ... *G09G 3/2092* (2013.01); *G09G 2300/0426* (2013.01); *G09G 2310/0286* (2013.01); *G09G 2310/061* (2013.01); *G09G 2310/08* (2013.01)

(58) Field of Classification Search
None
See application file for complete search history.

(56) References Cited

U.S. PATENT DOCUMENTS

2011/0057926 A1* 3/2011 Shang .................... G11C 19/28
345/213
2017/0010731 A1 1/2017 Zhang et al.
(Continued)

FOREIGN PATENT DOCUMENTS

CN 1727972 A 2/2006
CN 103943083 A 7/2014
(Continued)

OTHER PUBLICATIONS

Machine translation of CN 107068088 (document on record) Published (Aug. 18, 2017) (Year: 2017).*
(Continued)

*Primary Examiner* — Kent W Chang
*Assistant Examiner* — Benjamin Morales

(57) ABSTRACT

A shift register unit, a driving device, a display device and a driving method are provided. The shift register unit includes an input circuit, a first pull-up node reset circuit, an output circuit, an output reset circuit, a pull-down node control circuit and a power-on initialization circuit. The power-on initialization circuit is configured to reset the pull-up node in response to a power-on initialization signal.

16 Claims, 6 Drawing Sheets

(56) References Cited

U.S. PATENT DOCUMENTS

| | | | |
|---|---|---|---|
| 2017/0032752 A1 | 2/2017 | Huang et al. | |
| 2017/0154565 A1 | 6/2017 | Qing et al. | |
| 2017/0256220 A1* | 9/2017 | Huang | G09G 3/20 |
| 2017/0316751 A1 | 11/2017 | Wang | |
| 2018/0122289 A1* | 5/2018 | Gu | G09G 3/2092 |
| 2018/0143478 A1 | 5/2018 | Kim et al. | |
| 2019/0139495 A1 | 5/2019 | Qin et al. | |

FOREIGN PATENT DOCUMENTS

| | | | |
|---|---|---|---|
| CN | 104252853 A | 12/2014 | |
| CN | 104778928 A | 7/2015 | |
| CN | 104851383 A | 8/2015 | |
| CN | 105185339 A | 12/2015 | |
| CN | 106409207 A | 2/2017 | |
| CN | 106652876 A | 5/2017 | |
| CN | 106710564 A | 5/2017 | |
| CN | 107068088 A | 8/2017 | |
| CN | 107464539 A | 12/2017 | |
| KR | 1020080002512 A | 1/2008 | |
| KR | 102014009880 A | 8/2014 | |

OTHER PUBLICATIONS

Extended European Search Report dated May 17, 2021; Appln. No. 18839590.9.
International Search Report and Written Opinion dated Aug. 17, 2018; PCT/CN2018/089281.
The First Chinese Office Action dated Mar. 4, 2019; Appln. No. 201710859100.3.

* cited by examiner display device
1 driving device
10

FIG. 11

SHIFT REGISTER UNIT, DRIVING DEVICE, DISPLAY DEVICE AND DRIVING METHOD

The present application claims the priority of Chinese patent application No. 201710859100.3, filed on Sep. 21, 2017, and the entire content disclosed by the Chinese patent application is incorporated herein by reference as part of the present application.

TECHNICAL FIELD

Embodiments of the present disclosure relate to a shift register unit, a driving device, a display device and a driving method.

BACKGROUND

In the field of display technology, for example, a pixel array of a liquid crystal display generally includes rows of gate lines and columns of data lines that intersect with each other. Driving of the gate lines can be implemented by an integrated driving circuit amounted on an array substrate. In recent years, with the continuous improvement of an amorphous silicon thin film process, a gate driving circuit can also be directly fabricated on a thin film transistor array substrate to form a GOA (Gate driver On Array) to drive gate lines.

For example, the GOA formed of a plurality of cascaded shift register units can be used to provide switching voltage signals for the rows of gate lines of a pixel array, thereby controlling the rows of gate lines to be turned on sequentially. Data signals are provided by data lines to the pixel units of a corresponding row in the pixel array in each period, thereby forming gray voltages required for displaying each grayscale of an image, and displaying each frame of the image.

SUMMARY

At least one embodiment of the present disclosure provides a shift register unit, and the shift register unit comprises an input circuit, a first pull-up node reset circuit, an output circuit, an output reset circuit, a pull-down node control circuit and a power-on initialization circuit. The input circuit is configured to charge a pull-up node in response to an input signal; the first pull-up node reset circuit is configured to reset the pull-up node under control of a reset signal; the output circuit is configured to output a first clock signal to an output terminal under control of a level of the pull-up node; the output reset circuit is configured to reset the output terminal under control of a level of a pull-down node; the pull-down node control circuit is configured to control the level of the pull-down node; and the power-on initialization circuit is configured to reset the pull-up node in response to a power-on initialization signal.

For example, in a shift register unit provided by an embodiment of the present disclosure, the input circuit is connected with an input terminal and the pull-up node; the first pull-up node reset circuit is connected with a reset terminal, a first voltage terminal and the pull-up node; the output circuit is connected with a first clock signal terminal, the output terminal and the pull-up node; the output reset circuit is connected with the output terminal, the first voltage terminal and the pull-down node; the pull-down node control circuit is connected with a second clock signal terminal, the first voltage terminal, the output terminal and the pull-down node; and the power-on initialization circuit is connected with an initialization terminal, the first voltage terminal and the pull-up node.

For example, in a shift register unit provided by an embodiment of the present disclosure, the pull-down node control circuit comprises a pull-down node charge circuit and a pull-down node reset circuit. The pull-down node charge circuit is connected with the second clock signal terminal, the first voltage terminal and the pull-down node and the pull-down node charge circuit is configured to charge the pull-down node in response to a second clock signal different from the first clock signal; and the pull-down node reset circuit is connected with the output terminal, the first voltage terminal and the pull-down node and the pull-down node reset circuit is configured to reset the pull-down node under control of a level of the output terminal.

For example, in a shift register unit provided by an embodiment of the present disclosure, the pull-down node charge circuit comprises a first transistor and a first capacitor. A gate electrode of the first transistor is connected with a first electrode of the first transistor and the gate electrode of the first transistor is configured to be connected with the second clock signal terminal to receive the second clock signal, and a second electrode of the first transistor is configured to be connected with the pull-down node to charge the pull-down node; and a first electrode of the first capacitor is connected with the pull-down node, and a second electrode of the first capacitor is connected with the first voltage terminal.

For example, in a shift register unit provided by an embodiment of the present disclosure, the pull-down node charge circuit comprises a first transistor and a first capacitor. A gate electrode of the first transistor is configured to be connected with the second clock signal terminal to receive the second clock signal, a first electrode of the first transistor is configured to be connected with a second voltage terminal to receive a second voltage, and a second electrode of the first transistor is configured to be connected with the pull-down node to charge the pull-down node; and a first electrode of the first capacitor is connected with the pull-down node, and a second electrode of the first capacitor is connected with the first voltage terminal.

For example, in a shift register unit provided by an embodiment of the present disclosure, the pull-down node reset circuit comprises a second transistor. A gate electrode of the second transistor is configured to be connected with the output terminal and to be controlled by the level of the output terminal, a first electrode of the second transistor is configured to be connected with the pull-down node to reset the pull-down node, and a second electrode of the second transistor is configured to be connected with the first voltage terminal to receive a first voltage.

For example, a shift register unit provided by an embodiment of the present disclosure further comprises a second pull-up node reset circuit. The second pull-up node reset circuit is connected with the second clock signal terminal, the first voltage terminal and the pull-up node, and the second pull-up node reset circuit is configured to reset the pull-up node in response to the second clock signal.

For example, in a shift register unit provided by an embodiment of the present disclosure, the second pull-up node reset circuit comprises a third transistor. A gate electrode of the third transistor is configured to be connected with the second clock signal terminal to receive the second clock signal, a first electrode of the third transistor is configured to be connected with the pull-up node to reset the pull-up node, and a second electrode of the third transistor is configured to be connected with the first voltage terminal to receive a first voltage.

For example, in a shift register unit provided by an embodiment of the present disclosure, the power-on initialization circuit comprises a fourth transistor. A gate electrode of the fourth transistor is configured to be connected with the initialization terminal to receive the power-on initialization signal, a first electrode of the fourth transistor is configured to be connected with the pull-up node to reset the pull-up node, and a second electrode of the fourth transistor is configured to be connected with the first voltage terminal to receive a first voltage.

For example, in a shift register unit provided by an embodiment of the present disclosure, the input circuit comprises a fifth transistor. A gate electrode of the fifth transistor is configured to be connected with a first electrode of the fifth transistor and the gate electrode of the fifth transistor is configured to be connected with the input terminal to receive the input signal, and a second electrode of the fifth transistor is configured to be connected with the pull-up node to charge the pull-up node.

For example, in a shift register unit provided by an embodiment of the present disclosure, the input circuit comprises a fifth transistor. A gate electrode of the fifth transistor is configured to be connected with the input terminal to receive the input signal, a first electrode of the fifth transistor is configured to be connected with the second voltage terminal to receive the second voltage, and a second electrode of the fifth transistor is configured to be connected with the pull-up node to charge the pull-up node.

For example, in a shift register unit provided by an embodiment of the present disclosure, the first pull-up node reset circuit comprises a sixth transistor. A gate electrode of the sixth transistor is configured to be connected with the reset terminal to receive the reset signal, a first electrode of the sixth transistor is configured to be connected with the pull-up node to reset the pull-up node, and a second electrode of the sixth transistor is configured to be connected with the first voltage terminal to receive a first voltage.

For example, in a shift register unit provided by an embodiment of the present disclosure, the output circuit comprises a seventh transistor and a second capacitor. A gate electrode of the seventh transistor is configured to be connected with the pull-up node, a first electrode of the seventh transistor is configured to be connected with the first clock signal terminal to receive the first clock signal, and a second electrode of the seventh transistor is configured to be connected with the output terminal to output the first clock signal. A first electrode of the second capacitor is connected with the gate electrode of the seventh transistor, and a second electrode of the second capacitor is connected with the second electrode of the seventh transistor.

For example, in a shift register unit provided by an embodiment of the present disclosure, the output reset circuit comprises an eighth transistor. A gate electrode of the eighth transistor is configured to be connected with the pull-down node, a first electrode of the eighth transistor is configured to be connected with the output terminal to output a first voltage to the output terminal, and a second electrode of the eighth transistor is configured to be connected with the first voltage terminal to receive the first voltage.

At least one embodiment of the present disclosure provides a driving device, and the driving device comprises a plurality of cascaded shift register units each of which is according to any embodiment of the present disclosure. Except a first-stage shift register unit, an input terminal of any one of the shift register units of other stages is connected with an output terminal of a shift register unit of a preceding stage; and except a last-stage shift register unit, a reset terminal of any one of the shift register units of other stages is connected with an output terminal of a shift register unit of a next stage.

For example, in a driving device provided by an embodiment of the present disclosure, power-on initialization circuits in the shift register units are configured to respond to a same power-on initialization signal.

At least one embodiment of the present disclosure provides a display device, and the display device comprises a driving device according to any one embodiment of the present disclosure.

At least one embodiment of the present disclosure provides a driving method of the shift register unit, comprising: providing the power-on initialization signal to the power-on initialization circuit to reset the pull-up node; providing the input signal to the input circuit to charge the pull-up node; resetting the output terminal by the output reset circuit under control of the level of the pull-down node; providing the first clock signal to the output terminal by the output circuit under control of the level of the pull-up node; and providing the reset signal to the first pull-up node reset circuit to reset the pull-up node.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

FIG. 11 is a schematic block diagram of a display device according to an embodiment of the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In a display panel technology, in order to realize low cost and narrow bezel, a GOA (Gate driver On Array) technology can be adopted, that is, a gate driving circuit is integrated into the display panel by a thin film transistor manufacturing process, thereby achieving advantages such as narrow bezel, reducing assembly cost and the like. The display panel can be a liquid crystal display (LCD) panel or an organic light emitting diode (OLED) display panel.

Figure 1:
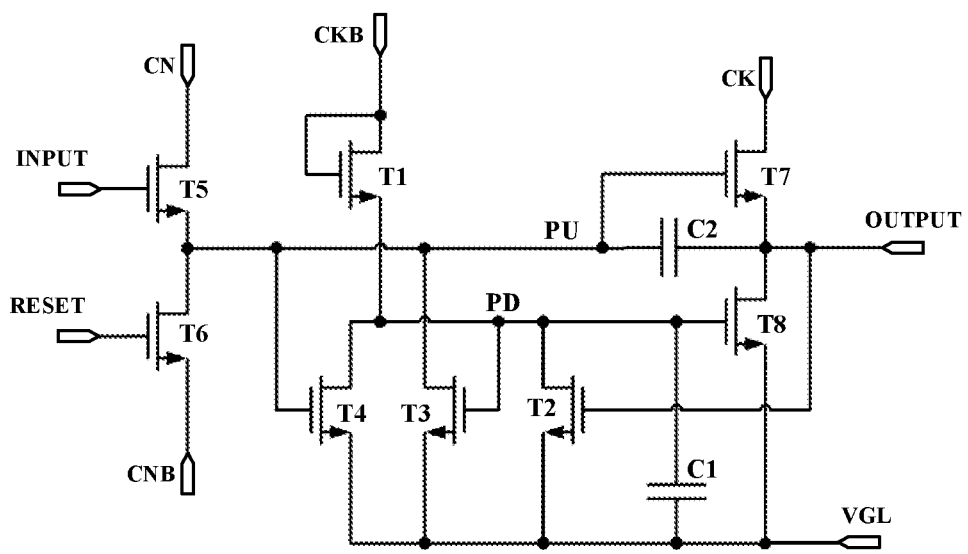
FIG. 1 is a circuit diagram of a shift register unit.

FIG. 1 shows a circuit structure of a shift register unit, and a plurality of the shift register unit can be cascaded to form a GOA driving device. As shown in FIG. 1, the shift register unit includes eight transistors (first transistor-eighth transistor) and two capacitors (first capacitor and second capacitor).

A gate electrode of a first transistor T1 is connected to a first electrode of the first transistor, the gate electrode of the first transistor T1 is configured to be connected to a second clock signal terminal CKB, and a second electrode of the first transistor T1 is connected to a pull-down node PD.

A gate electrode of a second transistor T2 is connected to an output terminal OUTPUT, a first electrode of the second transistor T2 is connected to the pull-down node PD, and a second electrode of the second transistor T2 is connected to a first voltage terminal VGL (for example, keeping inputting a direct current (DC) low-level signal).

A gate electrode of a third transistor T3 is connected to the pull-down node PD, a first electrode of the third transistor T3 is connected to the pull-up node PU, and a second electrode of the third transistor T3 is connected to the first voltage terminal VGL.

A gate electrode of a fourth transistor T4 is connected to the pull-up node PU, a first electrode of the fourth transistor T4 is connected to the pull-down node PD, and a second electrode of the fourth transistor T4 is connected to the first voltage terminal VGL.

A gate electrode of a fifth transistor T5 is connected to an input terminal INPUT, a first electrode of the fifth transistor T5 is connected to a high-level terminal CN (for example, keeping inputting a DC high-level signal), and a second electrode of the fifth transistor T5 is connected to the pull-up node PU.

A gate electrode of a sixth transistor T6 is connected to a reset terminal RESET, a first electrode of a sixth transistor T6 is connected to the pull-up node PU, and a second electrode of the sixth transistor T6 is connected to a low-level terminal CNB (for example, keeping inputting a DC low-level signal).

A gate electrode of a seventh transistor T7 is connected to the pull-up node PU, a first electrode of the seventh transistor T7 is connected to a first clock signal terminal CK, and a second electrode of the seventh transistor T7 is connected to the output terminal OUTPUT.

A gate electrode of an eighth transistor T8 is connected to the pull-down node PD, a first electrode of the eighth transistor T8 is connected to the output terminal OUTPUT, and a second electrode of the eighth transistor T8 is connected to the first voltage terminal VGL.

A first electrode of a first capacitor C1 is connected to the pull-down node PD, and a second electrode of the first capacitor C1 is connected to the first voltage terminal VGL.

A first electrode of a second capacitor C2 is connected to the pull-up node PU, and a second electrode of the second capacitor C2 is connected to the output terminal OUTPUT.

For example, the above-mentioned transistors are all N-type transistors. The following description is also made by taking N-type transistors as an example, but embodiments of the present disclosure are not limited to this case, for example, at least part of these transistors can be replaced with a P-type transistor or P-type transistors.

Figure 2:
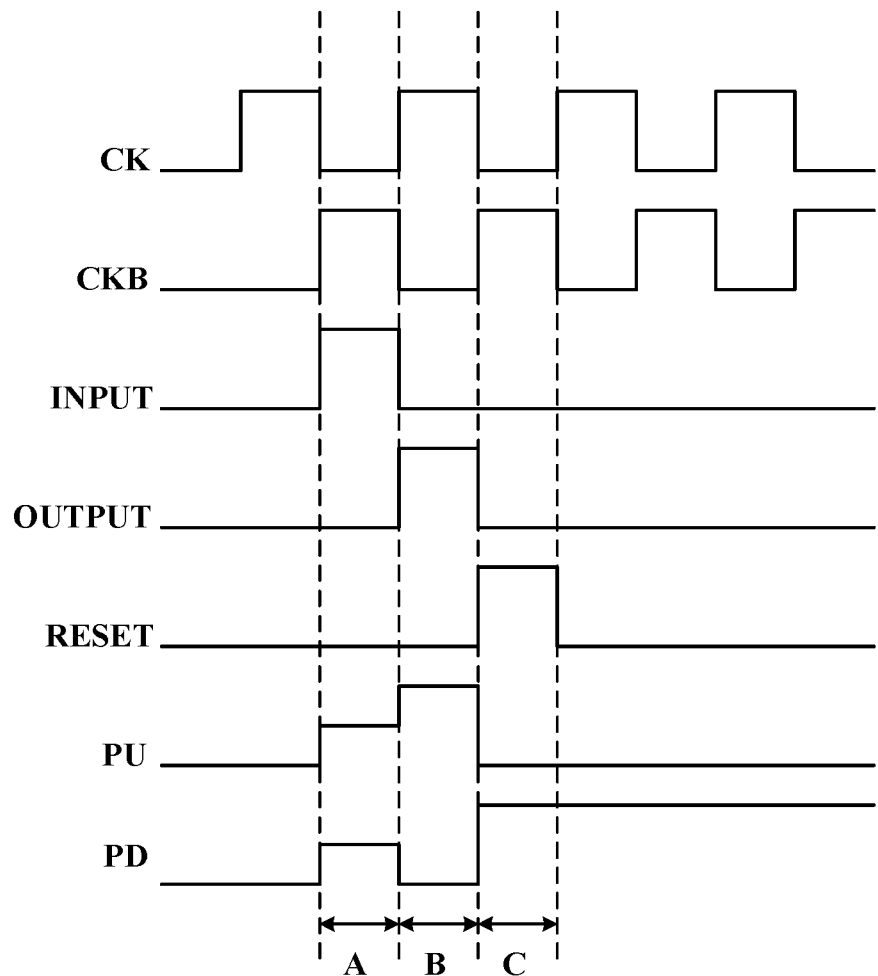
FIG. 2 is a signal timing diagram corresponding to an operation process of the shift register unit as shown in FIG. 1.

The operation principle of the shift register unit as shown in FIG. 1 is described below in combination with a signal timing diagram as shown in FIG. 2. In three stages including a first stage A, a second stage B and a third stage C as shown in FIG. 2, the shift register unit performs the following operations.

In the first stage A, the first clock signal terminal CK is input with a low-level signal, the second clock signal terminal CKB is input with a high-level signal, and the input terminal INPUT is input with a high-level signal. Because the input terminal INTPUT is input with a high-level signal, the fifth transistor T5 is turned on, the high-level signal inputted by the high-level terminal CN charges the second capacitor C2, and a potential of the pull-up node PU is pulled up to a first high level.

Because the second clock signal terminal CKB is input with a high-level signal, the first transistor T1 is turned on, and the high-level signal input by the second clock signal terminal CKB charges the pull-down node PD. Further, because the potential of the pull-up node PU is at the first high level, the fourth transistor T4 is turned on, thereby electrically connecting the pull-down node PD and the first voltage terminal VGL. In the above case, for example, the first voltage terminal VGL can be configured to keep inputting a DC low-level signal. In a design of the transistors, the first transistor T1 and the fourth transistor T4 can be configured (for example, size ratios, threshold voltages and the like of the first transistor T1 and the fourth transistor T4) when both transistors T1 and T4 are both turned on, the potential of the pull-down node PD is pulled down to a lower level, which does not cause the third transistor and the eighth transistor T8 to be turned on. It should be noted that the potential level of the signal timing diagram as shown in FIG. 2 is only illustrative and does not represent a real potential value.

Because the pull-up node PU is at the first high level, the seventh transistor T7 is turned on, and in this case, the first clock signal terminal CK is input with a low-level signal. Therefore, in the first stage A, the output terminal OUTPUT outputs the low-level signal.

In the second stage B, the first clock signal terminal CK is input with a high-level signal, the second clock signal terminal CKB is input with a low-level signal, and the input terminal INPUT is input with a low-level signal. Because the input terminal INPUT is input with a low-level signal, the fifth transistor T5 is turned off, and the pull-up node PU maintains the first high level of the previous stage, thereby enabling the seventh transistor T7 remains in a turn-on state. Because the first clock signal terminal CK is input with a high-level signal in this stage, the output terminal OUTPUT outputs the high-level signal.

Meanwhile, due to the bootstrap effect of the second capacitor C2, the level of the pull-up node PU is further pulled up to reach a second high level, thereby enabling the seventh transistor T7 to be turned on more sufficiently. Because the potential of the pull-up node PU is at a high level, the fourth transistor T4 remains in a turn-on state, thereby electrically connecting the pull-down node PD and the first voltage terminal VGL. At this time, the first transistor T1 is turned off due to the low-level signal input by the second clock signal terminal CKB, so the potential of the pull-down node PD is pulled down to a lower level at this stage than the first stage. Because the potential of the pull-down node PD is at a low level, the third transistor T3 and the eighth transistor T8 remain in a turn-off state, thereby not affecting the normal output of a shift signal of the shift register unit.

In the third stage C, the first clock signal terminal CK is input with a low-level signal, the second clock signal terminal CKB is input with a high-level signal, the input terminal INPUT continues to be input with a low-level signal, and the reset terminal RESET is input with a high-level signal. Because the reset terminal RESET is input with a high-level signal, the sixth transistor T6 is turned on, pulling the potential of the pull-up node PU to a low level which is input by the low-level terminal CNB (for example, keeping inputting a DC low-level signal), thereby enabling the seventh transistor T7 to be turned off.

Because the second clock signal terminal CKB is input with a high-level signal, the first transistor T1 is turned on, and the high-level signal input by the second clock signal terminal CKB charges the pull-down node PD. Because the potential of the pull-up node PU is at a low level, the fourth transistor T4 is turned off, the discharging path of the pull-down node PD is turned off, and the pull-down node PD is charged to a high level, thereby causing the third transistor T3 and the eighth transistor T8 to be turned on. The third transistor T3 and the eighth transistor T8 respectively pull down the potentials of the pull-up node PU and the output terminal OUTPUT to a low level which is input by the first voltage terminal VGL, thereby eliminating noises which may be generated by the output terminal OUTPUT and the pull-up node PU of the shift register unit during a non-output stage.

When the shift register unit is in operation, the pull-up node PU and the pull-down node PD have a mutual restriction therebetween. For example, when the potential of the pull-up node PU is at a high level, the potential of the pull-down node PD is pulled down to a low level. For another example, when the potential of the pull-down node PD is at a high level, the potential of the pull-up node PU is pulled down to a low level. The high potential or low potential of the pull-up node PU directly affects the output of the shift register unit, and the potential of the pull-up node PU should be stably maintained at a low level in the non-output stage, otherwise the shift register unit may be caused to output multiple times in a frame time. In the non-output stage, if the potential of the pull-down node PD is not well maintained at a high level, the potential of the pull-up node PU may drift, thereby affecting the normal output of a shift signal of the shift register unit.

In addition, in a case where the shift register unit is used in a display device, for example, the pull-up node PU is floated before the display device is powered on, and the potential of the pull-up node PU is uncertain in the floating state. For example, the seventh transistor T7 can be turned on if the potential of the pull-up node PU reaches to 2.5V, which can also cause the shift register unit to output multiple times within a frame time, causing the display device to display abnormally.

At least one embodiment of the present disclosure provides a shift register unit and the shift register unit includes an input circuit, a first pull-up node reset circuit, an output circuit, an output reset circuit, and a power-on initialization circuit. The input circuit is configured to charge a pull-up node in response to an input signal; the first pull-up node reset circuit is configured to reset the pull-up node under control of a reset signal; the output circuit is configured to output a first clock signal to an output terminal under control of a level of the pull-up node; the output reset circuit is configured to reset the output terminal under control of a level of a pull-down node; the power-on initialization circuit is configured to reset the pull-up node in response to a power-on initialization signal.

At least one embodiment of the present disclosure also provides a driving device, a display device, and a driving method corresponding to the above-described shift register unit.

The shift register unit, the driving device, the display device and the driving method provided by the embodiments of the present disclosure can pull down the potential of the pull-up node when power on is started, thereby enabling the potential of the pull-up node to be at a low level when power on is started. And at least one embodiment can also prevent the potential of the pull-up node from being drifted, so that the multiple output problem due to potential drift of the pull-up node in the non-output stage can be effectively avoided.

Hereinafter, embodiments of the present disclosure will be described in detail with reference to the accompanying drawings.

Figure 3:
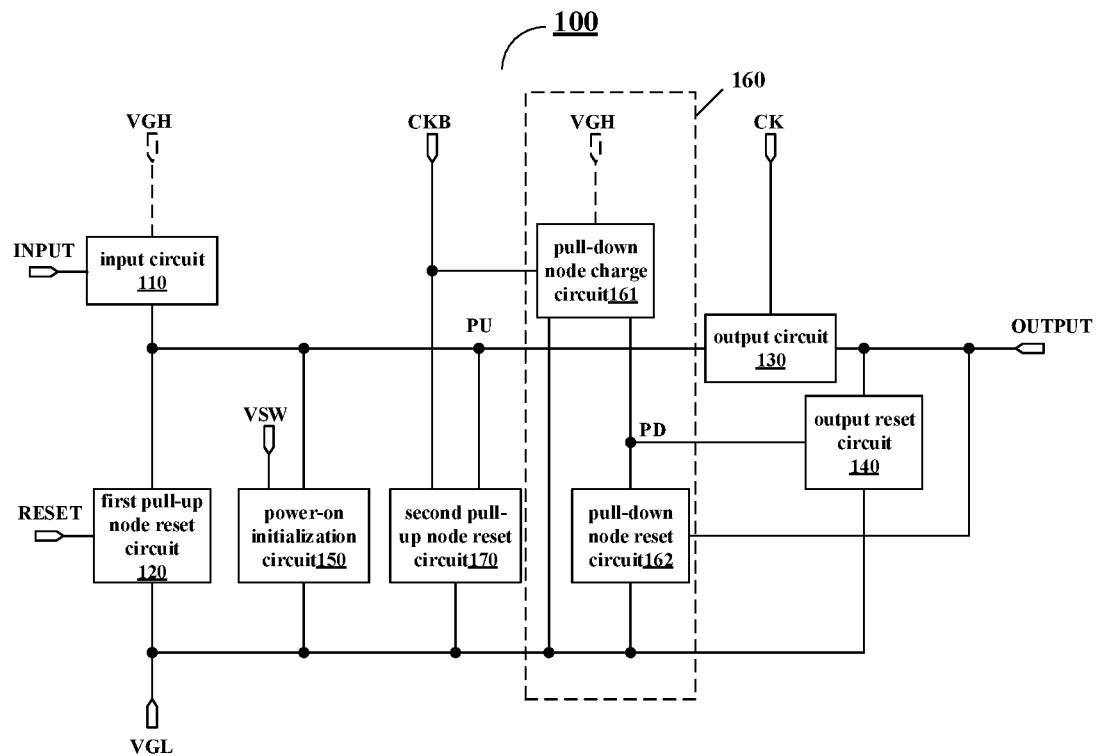
FIG. 3 is a schematic block diagram of a shift register unit according to an embodiment of the present disclosure.

An example of an embodiment of the present disclosure provides a shift register unit 100, as shown in FIG. 3, the shift register unit 100 includes an input circuit 110, a first pull-up node reset circuit 120, an output circuit 130, an output reset circuit 140, a pull-down node control circuit 160 and a power-on initialization circuit 150.

The input circuit 110 is configured to charge a pull-up node PU in response to an input signal. For example, the input circuit 110 can be connected with an input terminal INPUT and the pull-up node PU, the input circuit 110 is configured to cause the input terminal INPUT to be electrically connected with the pull-up node PU under control of an input signal inputted by the input terminal INPUT, and a high-level signal inputted by the input terminal INPUT can charge the pull-up node PU. For another example, the input circuit 110 can also be connected with a second voltage terminal VGH (for example, keeping inputting a DC high-level signal), the input circuit 110 is configured to cause the second voltage terminal VGH to be electrically connected with the pull-up node PU under control of the input signal, so that the high-level signal inputted by the second voltage terminal VGH can charge the pull-up node PU.

The first pull-up node reset circuit 120 is configured to reset the pull-up node PU under control of a reset signal. For example, the first pull-up node reset circuit 120 can be configured to be connected with a reset terminal RESET, a first voltage terminal VGL (for example, keeping inputting a DC low-level signal), and the pull-up node PU, thereby the first pull-up node reset circuit 120 can enable the pull-up node PU to be electrically connected with a low-level signal or a low-voltage terminal under control of the reset signal inputted by the reset terminal RESET, and the low-voltage terminal is, for example, the first voltage terminal VGL, so that the pull-up node PU can be pulled down and reset.

The output circuit 130 is configured to output a first clock signal to an output terminal OUTPUT under control of a level of the pull-up node PU. For example, the output circuit 130 can be configured to be connected with a first clock signal terminal CK, the output terminal OUTPUT and the pull-up node PU, and the output circuit 130 can enable the first clock signal terminal CK to be electrically connected with the output terminal OUTPUT under control of the level of the pull-up node PU, thereby outputting the first clock signal inputted by the first clock signal terminal CK to the output terminal OUTPUT.

The output reset circuit 140 is configured to reset the output terminal OUTPUT under control of a level of a pull-down node PD. For example, the output reset circuit 140 can be configured to be connected with the output terminal OUTPUT, the first voltage terminal VGL and the pull-down node PD, and the output reset circuit 140 can enable the output terminal OUTPUT to be electrically connected with the first voltage terminal VGL under control of the level of the pull-down node PD, thereby pulling down and resetting the output terminal OUTPUT.

The power-on initialization circuit 150 is configured to reset the pull up node PU in response to a power-on initialization signal. For example, the power-on initialization circuit 150 can be configured to be connected with an initialization terminal VSW, the first voltage terminal VGL and the pull-up node PU, and the power-on, initialization circuit 150 can enable the pull-up node PU to be electrically connected with the first voltage terminal VGL in response to the power-on initialization signal inputted by the initialization terminal VSW, thereby pulling down and resetting the pull-up node PU.

The pull-down node control circuit 160 is configured to be connected with a second clock signal terminal CKB, the first voltage terminal VGL, the output terminal OUTPUT and the pull-down node PD, and is configured to control the level of the pull-down node PD to control the output reset circuit 140.

For example, a plurality of shift register units 100 can be cascaded to form a driving device. In a case where the driving device is used to drive a display device and when the display device is powered on, for example, the power-on initialization circuit 150 of each stage shift register unit 100 can simultaneously pull down the potential of the pull-up node PU in the respective circuits in response to the same power-on initialization signal, so that the potential of the pull-up node PU remains at a low level during power-on, thereby effectively avoiding the multiple output problem due to potential drift of the pull-up node PU during the non-output stage.

For example, in an example of the present embodiment, the pull-down node control circuit 160 includes a pull-down node charge circuit 161 and a pull-down node reset circuit 162.

The pull-down node charge circuit 161 is configured to charge the pull-down node PD in response to a second clock signal different from the first clock signal. For example, the pull-down node charge circuit 161 can be configured to be connected with the second clock signal terminal CKB, the first voltage terminal VGL and the pull-down node PD, and the pull-down node charge circuit 161 can enable the second clock signal terminal CKB to be electrically connected with the pull-down node PD under control of a signal inputted by the second clock signal terminal CKB, thereby the high-level signal inputted by the second clock signal terminal CKB can charge the pull-down node PD. For another example, the pull-down node charge circuit 161 can also be configured to be connected with the second voltage terminal VGH, and the pull-down node charge circuit 161 call enable the second voltage terminal VGH to be electrically connected with the pull-down node PD under control of the second clock signal inputted by the second clock signal terminal CKB, thereby the high-level signal inputted by the second voltage terminal VGH can charge the pull-down node PD.

The pull-down node reset circuit 162 is configured to reset the pull-down node PD under control of a level of the output terminal OUTPUT. For example, the pull-down node reset circuit 162 can be configured to be connected with the output terminal OUTPUT, the first voltage terminal VGL and the pull-down node PD, and the pull-down node reset circuit 162 can enable the pull-down node PD to be electrically connected with the first voltage terminal VGL under control of the level of the output terminal OUTPUT, thereby pulling down and resetting the pull-down node PD.

For another example, in another example of an embodiment of the present disclosure, as shown in FIG. 3, the shift register unit 100 further includes a second pull-up node reset circuit 170.

The second pull up node reset circuit 170 is configured to reset the pull up node PU in response to the second clock signal. For example, the second pull-up node reset circuit 170 can be configured to be connected with the second clock signal terminal CKB, the first voltage terminal VGL and the pull-up node PU, and the second pull-up node reset circuit 170 can enable the pull-up node PU to be electrically connected with the first voltage terminal VGL under the second clock signal inputted by the second clock signal terminal CKB, thereby pulling down and resetting the pull-up node PU.

In the shift register unit provided in this example, the pull-up node PU and the pull-down node PD no longer have a mutual restriction. The potential of the pull-up node PU is no longer affected by the potential of the pull-down node PD, so in the non-output stage, the potential of the pull-up node PU can be effectively maintained at a normal potential, thereby effectively avoiding the multiple output problem due to the potential drift of the pull-up node PU.

It should be noted that, for example, the first voltage terminal VGL in the embodiment of the present disclosure keeps inputting a DC low-level signal, and this DC low level is referred to as the first voltage. The second voltage terminal VGH keeps inputting a DC high level, and this DC high level is referred to as the second voltage. The following embodiments are the same as those described herein, which will not be described again.

In addition, the second voltage terminal VGH connected with the input circuit 110 and the pull-down node charge circuit 161 in FIG. 3 is shown by a broken line, thereby indicating that the shift register unit 100 may include the second voltage terminal VGH or may not include the second voltage terminal VGH, which is not limited in the embodiments of the present disclosure.

Figure 4:
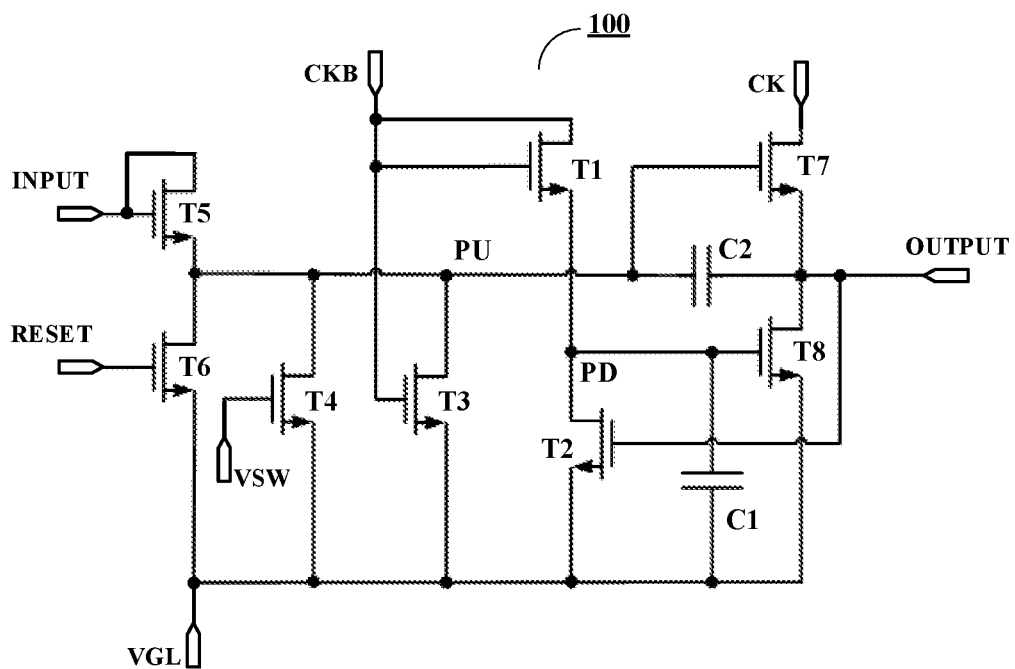
FIG. 4 is a circuit diagram showing an implementation example of the shift register unit as shown in FIG. 3.

For example, the shift register unit 100 as shown in FIG. 3 can be implemented as the circuit structure as shown in FIG. 4 in an example. As shown in FIG. 4, the shift register unit 100 includes transistors from a first transistor T1 to an eighth transistor T8, a first capacitor C1 and a second capacitor C2.

For example, as shown in FIG. 4, in this example, in more detail, the pull-down node charge circuit 161 can be implemented to include the first transistor T1 and the first capacitor C1. A gate electrode of the first transistor T1 is connected with a first electrode of the first transistor T1, and the gate electrode of the first transistor T1 is configured to be connected with the second clock signal terminal CKB to receive the second clock signal, and a second electrode of the first transistor T1 is configured to be connected with the pull-down node PD to charge the pull-down node PD. A first electrode of the first capacitor is connected with the pull-down node PD, and the second electrode is connected with the first voltage terminal VGL.

The pull-down node reset circuit 162 can be implemented as a second transistor T2. A gate electrode of the second transistor T2 is configured to be connected with the output terminal OUTPUT to be under control of the level of the output terminal OUTPUT, a first electrode of the second transistor T2 is configured with the pull-down node PD to reset the pull-down node PD, and the second electrode of the second transistor 12 is configured to be connected with the first voltage terminal VGL to receive the first voltage.

The second pull-up node reset circuit 170 can be implemented as a third transistor T3. A gate electrode of the third transistor T3 is configured to be connected with the second clock signal terminal CKB to receive the second clock signal, a first electrode of the third transistor T3 is configured to be connected with the pull-up node PU to reset the pull-up node PU, and a second electrode of the third transistor 13 is configured with the first voltage terminal VGL to receive the first voltage.

The power-on initialization circuit 150 can be implemented as a fourth transistor T4. A gate electrode of the fourth transistor T4 is configured to be connected with the initialization terminal VSW to receive the power-on initialization signal, a first electrode of the fourth transistor T4 is configured to be connected with the pull-up node PU to reset the pull-up node PU, and a second electrode of the fourth transistor T4 is configured to be connected with the first voltage terminal VGL to receive the first voltage.

The input circuit 110 can be implemented as a fifth transistor T5. A gate electrode of the fifth transistor T5 is connected with a first electrode of the fifth transistor T5, and the gate electrode of the fifth transistor T5 is configured to be connected with the input terminal INPUT to receive the input signal, and a second electrode of the fifth transistor T5 is configured to be connected with the pull-up node PU to charge the pull-up node PU.

The first pull-up node reset circuit 120 can be implemented as a sixth transistor T6. A gate electrode of the sixth transistor T6 is configured to be connected with the reset terminal RESET to receive the reset signal, and a first electrode of the sixth transistor T6 is configured to be connected with the pull-up node PU to reset the pull-up node PU, and a second electrode of the sixth transistor T6 is configured to be connected with the first voltage terminal VGL to receive the first voltage.

The output circuit 130 can be implemented to include a seventh transistor T7 and a second capacitor C2. A gate electrode of the seventh transistor T7 is configured to be connected with the pull-up node PU, a first electrode of the seventh transistor T7 is configured to be connected with the first clock signal terminal CK to receive the first clock signal, and a second electrode of the seventh transistor T7 is configured to be connected with the output terminal OUTPUT to output the first clock signal. A first electrode of the second capacitor C2 is connected with the gate electrode of the seventh transistor T7, and a second electrode of the second capacitor C2 is connected with the second electrode of the seventh transistor T7.

The output reset circuit 140 can be implemented as an eighth transistor T8. A gate electrode of the eighth transistor T8 is configured to be connected with the pull-down node PD, a first electrode of the eighth transistor T8 is configured to be connected with the output terminal OUTPUT to output the first voltage to the output terminal OUTPUT, and a second electrode of the eighth transistor T8 is configured to be connected with a first voltage terminal VGL to receive the first voltage.

Figure 5:
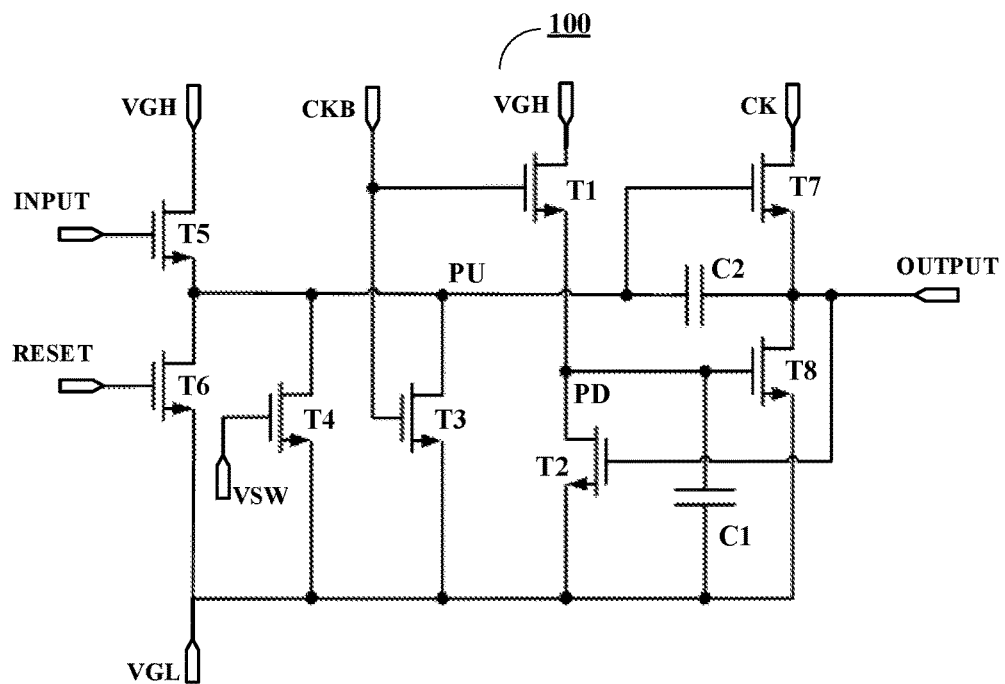
FIG. 5 is a circuit diagram showing another implementation example of the shift register unit as shown in FIG. 3.

For example, the shift register unit 100 as shown in FIG. 3 can also be implemented as the circuit structure as shown in FIG. 5 in another example. As shown in FIG. 5, the shift register unit 100 also includes transistors from first transistor T1 to eighth transistor T8, a first capacitor C1 and a second capacitor C2.

The circuit structure as shown in FIG. 5 differs from the circuit structure as shown in FIG. 4 in the manner in which the first transistor T1 and the fifth transistor T5 are connected. In this case, the first electrode of the first transistor T1 is no longer connected with the gate electrode of the first transistor T1 but with the second voltage terminal VGH. Similarly, the first electrode of the fifth transistor T5 is no longer connected with the gate electrode of the fifth transistor T5 but with the second voltage terminal VGH. With such a connection as shown in FIG. 5, response speeds and driving ability of the first transistor T1 and the fifth transistor T5 can be improved.

It should be noted that the transistors in the embodiments of the present disclosure can adopt thin film transistors, field-effect transistors or other switching devices with the same characteristics. In the embodiments of the present disclosure, thin film transistors are adopted as an example for description. Source electrodes and drain electrodes of the transistors adopted herein can be symmetrical in structure, so the source electrodes and drain electrodes cannot be different structurally. In the embodiment of the present disclosure, in order to distinguish between two electrodes of a transistor other than a gate electrode, it is directly described that one of the two electrodes is a first electrode and the other electrode is a second electrode.

In addition, the transistors in the embodiments of the present disclosure are all described by taking an N-type transistor as an example. In this case, the first electrode can be a drain electrode and the second electrode can be a source electrode. It should be noted that, the embodiments of the present disclosure include, but are not limited to, the examples. For example, one or more switches in the pixel circuit provided in the embodiments of the present disclosure can also adopt P-type thin film transistors. In this case, the first electrode can be a source electrode and the second electrode can be a drain electrode. For a different type of transistor, each electrode of this transistors need to be correspondingly connected with reference to each electrode of the corresponding transistor employed in examples of the embodiments of the present disclosure.

For example, as shown in FIG. 5, each of the transistors in the shift register unit 100 is implemented as an N-type transistor, the first voltage terminal VGL keeps inputting the first voltage at a DC low level, and the second voltage terminal VGH keeps inputting the second voltage at a DC high level. The first clock signal terminal CK is input with the first clock signal, and the second clock signal terminal CKB is input with a second clock signal different from the first clock signal.

Figure 6:
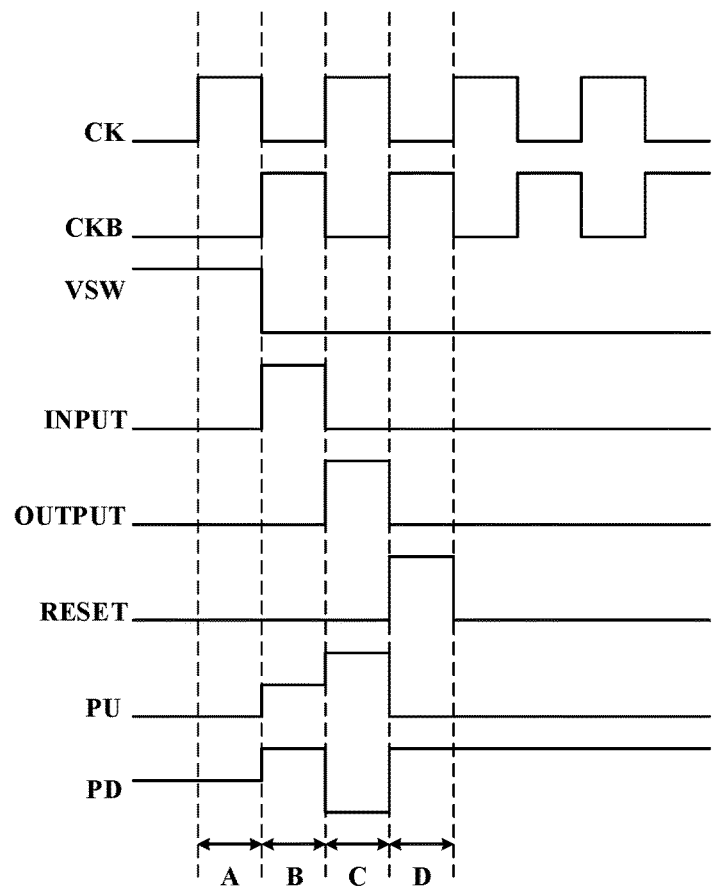
FIG. 6 is a signal timing diagram corresponding to an operation process of the shift register unit as shown in FIG. 5.

The operation principle of the shift register unit 100 as shown in FIG. 5 is described below in combination with a signal timing diagram as shown in FIG. 6. In four stages including a first stage A, a second stage B, a third stage C and a fourth stage D as shown in FIG. 6, the shift register unit 100 performs the following operations.

In the first stage A, the initialization terminal VSW is input with a high-level signal. Because the initialization terminal VSW is input with a high-level signal, the fourth transistor T4 is turned on, so that the pull-up node PU and the first voltage terminal VGL are electrically connected, and the potential of the pull-up node PU is pulled down to a low level. The seventh transistor T7 is turned off due to the low level of the pull-up node PU. Therefore, even if the first clock signal terminal CK is input with a high-level signal at this stage, the output terminal OUTPUT cannot output the high-level signal. It should be noted that, the potential of the pull-down node PD is uncertain in this stage, and only the potential of the pull-down node PD in the first stage A is schematically shown in FIG. 6. In addition, at this stage, other transistors are also turned off, and will not be described again.

In the second stage B, the first clock signal terminal CK is input with a low-level signal, the second clock signal terminal CKB is input with a high-level signal, and the input terminal INPUT is input with a high-level signal. Because the input terminal INTPUT is input with a high-level signal, the fifth transistor T5 is turned on, so that the high level inputted by the second voltage terminal VGH charges the second capacitor C2, and the potential of the pull-up node PU is pulled up to the first high level. Because the pull-up node PU is at the first high level, the seventh transistor T7 is turned on, and at this time, the first clock signal terminal CK is input with a low-level signal, so at this stage, the output terminal OUTPUT outputs the low-level signal.

Because the second clock signal terminal CKB is input with a high-level signal, the third transistor T3 is turned on, so that the pull-up node PU and the first voltage terminal VGL are electrically connected. In the design of the transistors, the third transistor T3 and the fifth transistor T5 can be configured (for example, size ratios, threshold voltages and the like of the third transistor T3 and the fifth transistor T5) when both T3 and T5 are turned on, the level of the pull-up node PU can stay at the first high level without being pulled down.

Similarly, the first transistor T1 is turned on due to the high-level signal input by the second clock signal terminal CKB, and the high-level signal input by the second voltage terminal VGH charges the first capacitor C1, and the potential of the pull-down node PD is pulled up. At the same time, the second transistor T2 is turned down due to the low level of the output terminal OUTPUT, and the discharge path of the pull-down node PD is turned off, so in the second stage B, the potential of the pull-down node PD is maintained at a high level. The eighth transistor T8 is turned on due to the high level of the pull-down node PD, so the potential of the output terminal OUTPUT is further pulled down, and the effect of output noise reduction can be achieved.

In the third stage C, the first clock signal terminal CK is input with a high-level signal, the second clock signal terminal CKB is input with a low-level signal, and the input terminal INPUT continues to be input with a low-level signal. Because the input terminal INPUT is input with a low-level signal, the fifth transistor T5 is turned off, and the pull-up node PU maintains the first high level of the previous stage, thereby enabling the seventh transistor T7 to be in a turn-on state. Because the first clock signal terminal CK is input with a high-level signal in this stage, the output terminal OUTPUT outputs the high-level signal. Due to the bootstrap effect of the second capacitor C2, the potential of the pull-up node PU is further pulled up to reach a second high level, thereby enabling the seventh transistor T7 to be turned on more sufficiently.

Because the output terminal OUTPUT is at a high level, the second transistor T2 is turned on, and the pull-down node PD is electrically connected with the first voltage terminal VGL. And at this time, the first transistor T1 is turned off due to the low-level signal input by the second clock signal terminal, so the first capacitor C1 is discharged through the second transistor, and the potential of the pull-down node PD is pulled down to a low level.

Because the second clock signal terminal CKB is input with a low-level signal, the third transistor T3 maintains a turn-off state, and the potential of the pull-up node PU is not affected. At the same time, because the potential of the pull-down node PD is at a low level, the eighth transistor T8 maintains a turn-off state, thereby not affecting the normal output of a shift signal of the shift register unit 100.

In the fourth stage D, the first clock signal terminal CK is input with a low-level signal, the second clock signal terminal CKB is input with a high-level signal, the input terminal INPUT continues to be input with a low-level signal, and the reset terminal RESET is input with a high-level signal. Because the reset terminal RESET is input with a high-level signal, the sixth transistor T6 is turned on, pulling down the potential of the pull-up node PU to the low level input by the first voltage terminal VGL, thereby turning off the seventh transistor T7.

Because the second clock signal terminal CKB is input with the high-level signal, the first transistor T1 is turned on, the high-level signal input by the second voltage terminal VGH charges the first capacitor C1, and the potential of the pull-down node PD is pulled up to a high level. Because the potential of the pull-down node PD is at a high level, the eighth transistor T8 is turned on, and the eighth transistor T8 enables the output terminal OUTPUT to be electrically connected with the first voltage terminal VGL, thereby pulling down and resetting the output terminal OUTPUT. At this stage, the second transistor T2 maintains a turn-off state due to the low level of the output terminal OUTPUT, so that the potential of the pull-down node PD can be kept at the high level.

At the same time, because the second clock signal terminal CKB is input with a high-level signal, the third transistor T3 is turned on, thereby enabling the low level input by the first voltage terminal VGL to further pull down the potential of the pull-up node PU, and enabling the potential of the pull-up node PU to be kept at a low level in this stage.

For example, a plurality of shift register units 100 as shown in FIG. 4 or FIG. 5 can be cascaded to form a driving device. In a case where the driving device is used to drive a display device and when the display device is powered on, for example, the initialization terminals VSW of all the stage shift register units 100 can be input with a same power-on initialization signal simultaneously, and the power-on initialization signal pulls down the potential of the pull-up node PU in each stage shift register unit 100, so that the potential of the pull-up node PU remains at a low level during power-on, thereby effectively avoiding the multiple output problem due to the potential drift of the pull-up node PU during the non-output stage.

At the same time, the pull-up node PU and the pull-down node PD no longer have a mutual restriction. The second clock signal input by the second clock signal terminal CKB can individually control the potential of the pull-up node PU, the potential of the pull-up node PU is no longer affected by the potential of the pull-down node PD, so in the non-output stage, the multiple output problem due to the potential drift of the pull-up node PU can effectively avoided.

It should be noted that, the working principle of the shift register unit 100 as shown in FIG. 4 can be referred to the corresponding description of the shift register unit 100 as shown in FIG. 5, and details are not described herein again.

Figure 7:
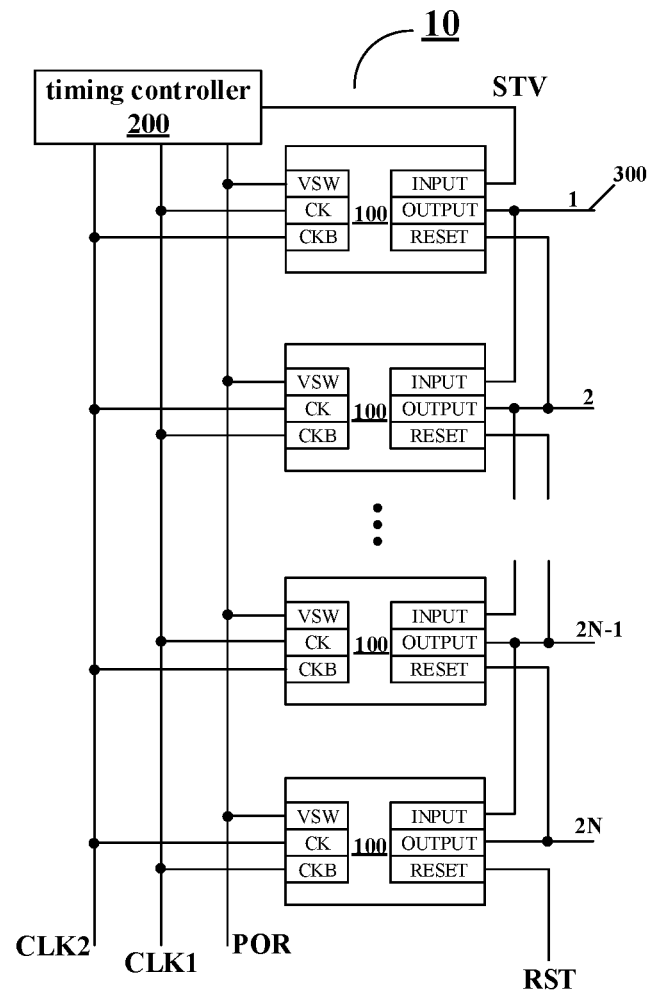
FIG. 7 is a schematic diagram of a driving device according to an embodiment of the present disclosure.

At least one embodiment of the present disclosure provides a driving device 10, as shown in FIG. 7, the driving device 10 includes a plurality of cascaded shift register units 100, and the shift register unit 100 can adopt any shift register unit provided in the above embodiments. The driving device 10 can be directly integrated onto an array substrate of a display device by adopting the processes similar to those for forming a thin film transistor, and can realize the function of performing display line by line.

For example, as shown in FIG. 7, except the first-stage shift register unit, an input terminal INPUT of any one of the shift register units of the other stages is connected with an output terminal OUTPUT of the shift register unit of the preceding stage. Except the last-stage shift register unit, a reset terminal RST of any one of the shift register units of the other stages is connected with an output terminal OUTPUT of the shift register of the next stage. For example, the input terminal INPUT of the first-stage shift register unit can be configured to receive a trigger signal STV, and the reset terminal RST of the last-stage shift register unit can be configured to receive a reset signal RESET.

For example, as shown in FIG. 7, in a case where the driving device 10 is used to drive a display panel, the driving device 10 can be disposed on one side of the display panel in an example. For example, the display panel includes 2N rows of gate lines 300 (N is an integer greater than zero), and the output terminal OUTPUT of each stage of the shift register units 100 in the driving device 10 can be configured to sequentially connected to the 2N rows of gate lines 300 (as indicated by the references 1, 2, . . . , 2N−1, and 2N in FIG. 7, N is an integer greater than zero), such that scan signals can be output in a progressive way.

For example, as shown in FIG. 7, clock signals can be supplied to the clock signal terminals (the first clock signal terminal CK and the second clock signal terminal CKB) in each of the shift register units 100 by two system clock signals CLK1 and CLK2. For example, a first clock signal terminal CK of the first-stage shift register unit 100 is input with the signal CLK1, and a second clock signal terminal CKB of the first-stage shift register unit 100 is input with the signal CLK2; a first clock signal terminal CK of a second-stage shift register unit 100 is input with the signal CLK2, and a second clock signal terminal CKB of the second-stage shift register unit 100 is input with the signal CLK1; and similarly, a first clock signal terminal CK of a (2N−1)th-stage shift register unit 100 is input with the signal CLK1, and a second clock signal terminal CKB of the (2N−1)th-stage shift register unit 100 is input with the signal CLK2; and a first clock signal terminal CK of a (2N)th-stage shift register unit 100 is input with the signal CLK2, and a second clock signal terminal CKB of the (2N)th-stage shift register unit 100 is input with the signal CLK1. Further, the initialization terminal VSW of each stage of the shift register units 100 can be connected with a same signal line in response to a same power-on initialization signal POR.

Figure 8:
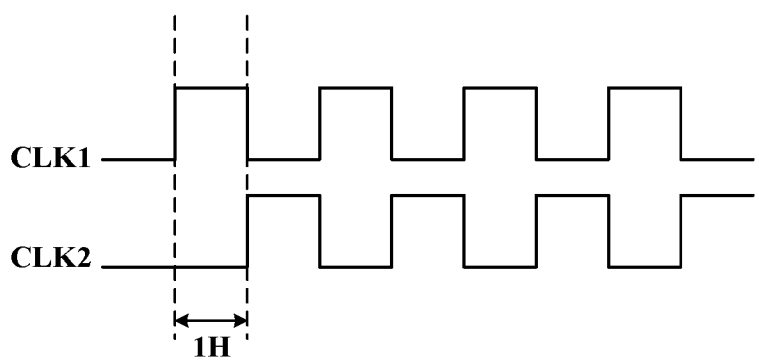
FIG. 8 is a timing diagram of a clock signal having a duty ratio of 50% for the driving device as shown in FIG. 7.

For example, as shown in FIG. 8, signals CLK1 and CLK2 each can adopt a timing signal of 50% duty ratio. Because the shift register unit 100 of each stage is sequentially arranged row by row in the case as shown in FIG. 7, the timing of the CLK1 and the timing of the CLK2 are staggered by a system clock time of 1H.

It should be noted that, when a display panel is driven by using the driving device 10 as shown in FIG. 7, the driving device 10 can be symmetrically disposed on both sides of the display panel, so that the output terminals OUTPUT of the two driving devices 10 are connected with both ends of each of the corresponding gate lines, thereby achieving a bilateral driving mode. For example, the bilateral driving mode can be used in driving a large-sized display panel to solve the problem of large load on the gate line.

Figure 9:
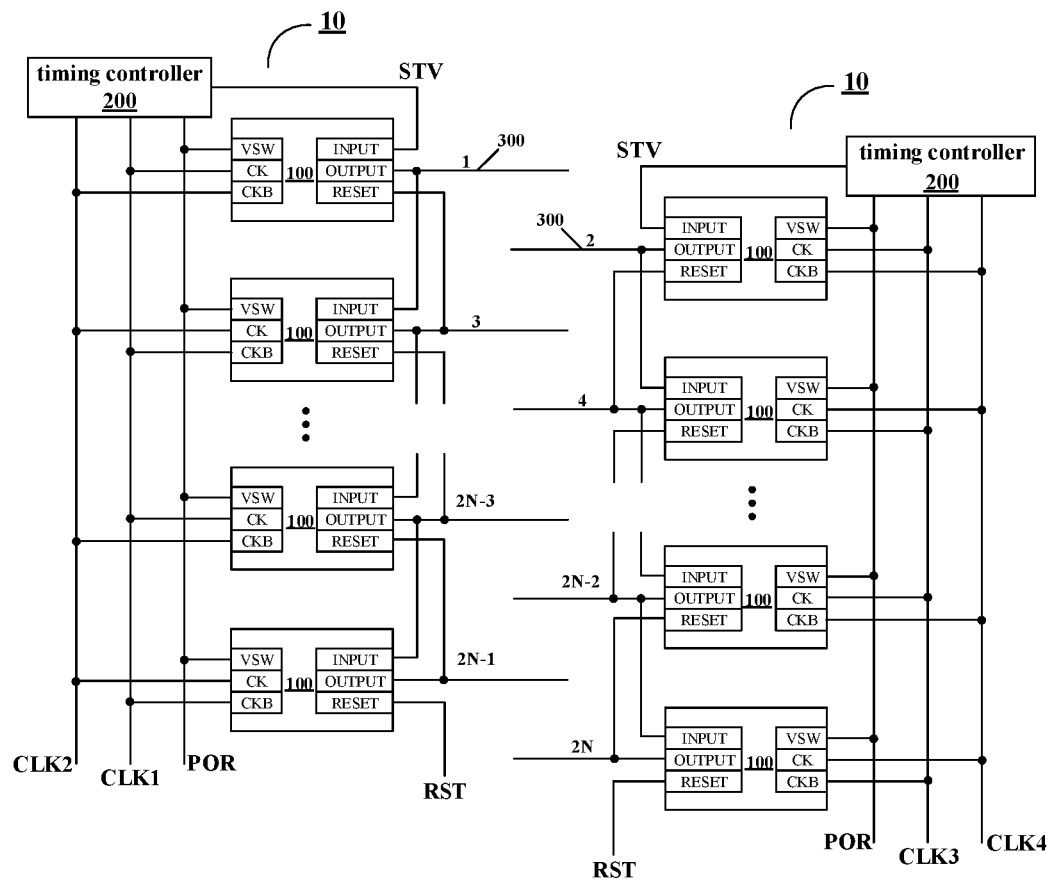
FIG. 9 is a schematic diagram of another driving device according to an embodiment of the present disclosure.

For example, in another example of the embodiment of the present disclosure, as shown in FIG. 9, in a case where the driving device 10 is provided on both sides of the display panel (bilateral driving), it is also possible to use the driving device 10 on one side of the display panel for driving gate lines of the odd-numbered gate lines 300 (as indicated by the references 1, 3, . . . , 2N−3, and 2N−1 in FIG. 9, N is an integer greater than zero), and use the driving device 10 on the other side of the display panel for driving gate lines of the even-numbered gate lines 300 (as indicated by the references 2, 4, . . . , 2N−2, and 2N in FIG. 9, N is an integer greater than zero). It should be noted that, in FIG. 9, similar to the driving device 10 on the left side, the driving device 10 on the right side can provide clock signals to clock signal terminals (the first clock signal terminal CK and the second clock signal terminal CKB) of each shift register unit 100 by two system clock signals CLK3 and CLK4, and the timing of the CLK3 and the timing of the CLK4 are staggered by two system clock times 2H. The clock signal CLK1 and the clock signal CLK3 can be a same clock signal, and the clock signal CLK2 and the clock signal CLK4 can be a same clock signal.

Figure 10:
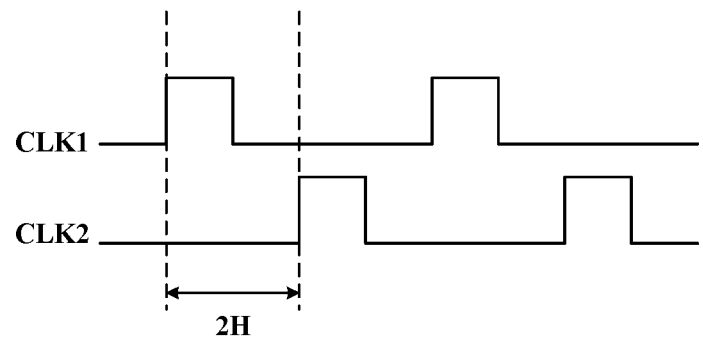
FIG. 10 is a timing diagram of a clock signal having a duty ratio of 25% for the driving device as shown in FIG. 9.

Corresponding to the case as shown in FIG. 9, for example, as shown in FIG. 10, signals CLK1 and CLK2 each can adopt a timing signal of 25% duty ratio, because the driving device 10 on each side is interlaced in the case as shown in FIG. 9, the timing of the CLK1 and the timing of the CLK2 are staggered by two system clock times 2H.

In a case where a display panel is driven by the driving device as shown in FIG. 9, each stage of the shift register unit 100 in the driving devices 10 on both sides of the display panel can occupy a space of two-pixel height, thus, the frame width of the display panel can be reduced under the premise that the area occupied by the shift register unit 100 is constant, which is advantageous for realizing a narrow bezel.

For example, as shown in FIG. 7 and FIG. 9, the driving device 10 can further include a timing controller 200. The timing controller 200 is configured, for example, to provide the clock signals (CLK1, CLK2) to each stage of the shift register units 100, and the timing controller 200 can also be configured to provide the trigger signal STV, the reset signal RST and the power-on initialization signal POR.

It should be noted that embodiments of the present disclosure include, but are not limited to, the above, the timing controller 200 can also be configured to provide four different clock signals to each stage of the shift register units 100 through four clock signal lines, which is not limited in the embodiments of the present disclosure.

The technical effects of the driving device 10 provided in the embodiments of the present disclosure can refer to the corresponding descriptions of the shift register units 100 in the above embodiments, and details are not described herein again.

Figure 11:
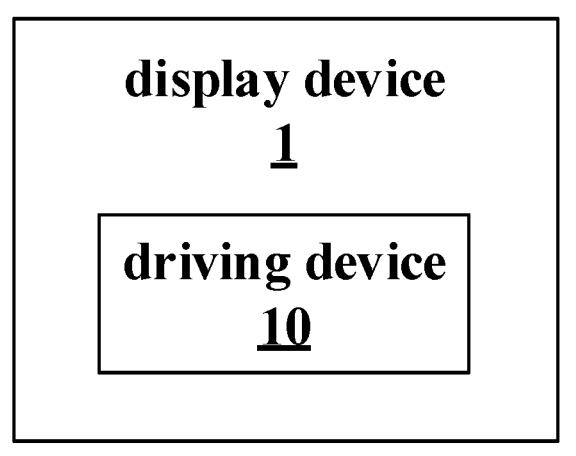

At least one embodiment of the present disclosure provides a display device 1, as shown in FIG. 11, the display device 1 includes any one of the driving device 10 provided in the above embodiments.

It should be noted that the display device in this embodiment can be a liquid crystal panel, a liquid crystal television, a display, an OLED panel, an OLED television, an electronic paper, a mobile phone, a tablet computer, a notebook computer, a digital photo frame, a navigator and other products or members having display function. The display device 1 further includes other conventional members, such as a display panel, which are not limited by the embodiments of the present disclosure.

The technical effects of the display device 1 provided in the embodiments of the present disclosure can refer to the corresponding descriptions of the shift register units 100 in the above embodiments, and details are not described herein again.

At least one embodiment of the present disclosure further provides a driving method which can be used to drive any one of the shift register units 100 provided in the embodiments of the present disclosure. For example, the driving method includes the following operations.

Providing the power-on initialization signal to the power-on initialization circuit 150 to reset the pull-up node PU; providing the input signal to the input circuit 110 to charge the pull-up node PU; resetting the output terminal OUTPUT by the output reset circuit 140 under control of the level of the pull-down node PD; providing the first clock signal to the output terminal OUTPUT by the output circuit 130 under control of the level of the pull-up node PU; and providing the reset signal to the first pull-up node reset circuit 120 to reset the pull-up node PU.

For example, in a first stage A as shown in FIG. 6, providing the power-on initialization signal to the power-on initialization circuit 150 to reset the pull-up node PU.

In a second stage B as shown in FIG. 6, providing the input signal to the input circuit 110 to charge the pull-up node PU; and resetting the output terminal OUTPUT by the output reset circuit 140 under control of the level of the pull-down node PD.

In the third stage C as shown in FIG. 6, the output circuit 130 providing the first clock signal to the output terminal OUTPUT under control of the level of the pull-up node PU.

In the fourth stage D as shown in FIG. 6, providing the reset signal to the first pull-up node reset circuit 120 to reset the pull-up node PU; resetting the output terminal OUTPUT by the output reset circuit 140 under control of the level of the pull-down node PD.

The driving method provided in this embodiment can pull down the potential of the pull-up node when a display device is powered on, so the potential of the pull-up node PU remains at a low level during power-on, and can also prevent the potential of the pull-up node from drifting, thereby effectively avoiding the multiple output problem due to potential drift of the pull-up node PU during the non-output stage.

It should be noted that, detailed descriptions of the driving method can refer to the descriptions of the operation principle of the shift register unit 100 in the embodiment of the present disclosure, and details are not described herein again.

What have been described above are only specific implementations of the present disclosure, the protection scope of the present disclosure is not limited thereto. The protection scope of the present disclosure should be based on the protection scope of the claims.

What is claimed is:

1. A shift register unit, comprising: an input circuit, a first pull-up node reset circuit, an output circuit, an output reset circuit, a pull-down node control circuit and a power-on initialization circuit, wherein the input circuit is configured to charge a pull-up node in response to an input signal;

the first pull-up node reset circuit is configured to reset the pull-up node under control of a reset signal;

the output circuit is configured to output a first clock signal to an output terminal under control of a level of the pull-up node;

the output reset circuit is configured to reset the output terminal under control of a level of a pull-down node;

the pull-down node control circuit is configured to control the level of the pull-down node; and the power-on initialization circuit is configured to reset the pull-up node in response to a power-on initialization signal, wherein the input circuit is connected with an input terminal and the pull-up node;

the first pull-up node reset circuit is connected with a reset terminal, first voltage terminal and the pull-up node;

the output circuit is connected with a first clock signal terminal, the output terminal and the pull-up node;

the output reset circuit is connected with the output terminal, the first voltage terminal and the pull-down node;

the pull-down node control circuit is connected with a second clock signal terminal, the first voltage ten final, the output terminal and the pull-down node; and the power-on initialization circuit is connected with an initialization terminal, the first voltage terminal and the pull-up node, wherein the pull-down node control circuit comprises a pull-down node charge circuit and a pull-down node reset circuit, the pull-down node charge circuit is connected with the second clock signal terminal, the first voltage terminal and the pull-down node, and the pull-down node charge circuit is configured to charge the pull-down node in, response to a second clock signal different from the first clock signal; and the pull-down node reset circuit is connected with the output terminal, the first voltage terminal and the pull-down node, and the pull-down node reset circuit is configured to reset the pull-down node under control of a level of the output terminal, wherein the pull-down node charge circuit comprises a first transistor and a first capacitor, a gate electrode of the first transistor is configured to be connected with the second clock signal terminal to receive the second clock signal, a first electrode of the first transistor is configured to be connected with a second voltage terminal to receive a second voltage, and a second electrode of the first transistor is configured to be connected with the pull-down node to charge the pull-down node; and a first electrode of the first capacitor is connected with the pull-down node, and a second electrode of the first capacitor is connected with the first voltage terminal.

2. The shift register unit according to claim 1, wherein the pull-down node charge circuit comprises a first transistor and a first capacitor, a gate electrode of the first transistor is connected with a first electrode of the first transistor and the gate electrode of the first transistor is configured to be connected with the second clock signal terminal to receive the second clock signal, and a second electrode of the first transistor is configured to be connected with the pull-down node to charge the pull-down node; and a first electrode of the first capacitor is connected with the pull-down node, and a second electrode of the first capacitor is connected with the first voltage terminal.

3. The shift register unit according to claim 1, wherein the pull-down node reset circuit comprises a second transistor, a gate electrode of the second transistor is configured to be connected with the output terminal and to be controlled by the level of the output terminal, a first electrode of the second transistor is configured to be connected with the pull-down node to reset the pull-down node, and a second electrode of the second transistor is configured to be connected with the first voltage terminal to receive a first voltage.

4. The shift register unit according to claim 1, further comprising a second pull-up node reset circuit, wherein the second pull-up node reset circuit is connected with the second clock signal terminal, the first voltage terminal and the pull-up node, and the second pull-up node reset circuit is configured to reset the pull-up node in response to the second clock signal.

5. The shift register unit according to claim 4, wherein the second pull-up node reset circuit comprises a third transistor, a gate electrode of the third transistor is configured to be connected with the second clock signal terminal to receive the second clock signal, a first electrode of the third transistor is configured to be connected with the pull-up node to reset the pull-up node, and a second electrode of the third transistor is configured to be connected with the first voltage terminal to receive a first voltage.

6. The shift register unit according to claim 1, wherein the power-on initialization circuit comprises a fourth transistor, a gate electrode of the fourth transistor is configured to be connected with the initialization terminal to receive the power-on initialization signal, a first electrode of the fourth transistor is configured to be connected with the pull-up node to reset the pull-up node, and a second electrode of the fourth transistor is configured to be connected with the first voltage terminal to receive a first voltage.

7. The shift register unit according to claim 1, wherein the input circuit comprises a fifth transistor, a gate electrode of the fifth transistor is configured to be connected with a first electrode of the fifth transistor and the gate electrode of the fifth transistor is configured to be connected with the input terminal to receive the input signal, and a second electrode of the fifth transistor is configured to be connected with the pull-up node to charge the pull-up node.

8. The shift register unit according to claim 1, wherein the input circuit comprises a fifth transistor, a gate electrode of the fifth transistor is configured to be connected with the input terminal to receive the input signal, a first electrode of the fifth transistor is configured to be connected with the second voltage terminal to receive the second voltage, and a second electrode of the fifth transistor is configured to be connected with the pull-up node to charge the pull-up node.

9. The shift register unit according to claim 1, wherein the first pull-up node reset circuit comprises a sixth transistor, a gate electrode of the sixth transistor is configured to be connected with the reset terminal to receive the reset signal, a first electrode of the sixth transistor is configured to be connected with the pull-up node to reset the pull-up node, and a second electrode of the sixth transistor is configured to be connected with the first voltage terminal to receive a first voltage.

10. The shift register unit according to claim 1, wherein the output circuit comprises a seventh transistor and a second capacitor, a gate electrode of the seventh transistor is configured to be connected with the pull-up node, a first electrode of the seventh transistor is configured to be connected with the first clock signal terminal to receive the first clock signal, and a second electrode of the seventh transistor is configured to be connected with the output terminal to output the first clock signal; and a first electrode of the second capacitor is connected with the gate electrode of the seventh transistor, and a second electrode of the second capacitor is connected with the second electrode of the seventh transistor.

11. The shift register unit according to claim 1, wherein the output reset circuit comprises an eighth transistor, a gate electrode of the eighth transistor is configured to be connected with the pull-down node, a first electrode of the eighth transistor is configured to be connected with the output terminal to output a first voltage to the output terminal, and a second electrode of the eighth transistor is configured to be connected with the first voltage terminal to receive the first voltage.

12. A driving device, comprising a plurality of cascaded shift register units each of which is according to claim 1, wherein except a first-stage shift register unit, an input terminal of any one of the shift register units of other stages is connected with an output terminal of a shift register unit of a preceding stage; and except a last-stage shift register unit, a reset terminal of any one of the shift register units of other stages is connected with an output terminal of a shift register unit of a next stage.

13. The driving device according to claim 12, wherein power-on initialization circuits in the shift register units are configured to respond to a same power-on initialization signal.

14. A display device, comprising the driving device according to claim 12.

15. A driving method of the shift register unit according to claim 1, comprising:

providing the power-on initialization signal to the power-on initialization circuit to reset the pull-up node;

providing the input signal to the input circuit to charge the pull-up node;

resetting the output terminal by the output reset circuit under control of the level of the pull-down node;

providing the first clock signal to the output terminal by the output circuit under control of the level of the pull-up node; and providing the reset signal to the first pull-up node reset circuit to reset the pull-up node.

16. The shift register unit according to claim 2, wherein the power-on initialization circuit comprises a fourth transistor, a gate electrode of the fourth transistor is configured to be connected with the initialization terminal to receive the power-on initialization signal, a first electrode of the fourth transistor is configured to be connected with the pull-up node to reset the pull-up node, and a second electrode of the fourth transistor is configured to be connected with the first voltage terminal to receive a first voltage.

* * * * *